United States Patent
Kurata et al.

(10) Patent No.: US 7,282,525 B2
(45) Date of Patent: Oct. 16, 2007

(54) PELLICLE, PRODUCING METHOD THEREOF AND ADHESIVE

(75) Inventors: Hiroyuki Kurata, Yamaguchi (JP); Hideto Matsuoka, Yamaguchi (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/026,805

(22) Filed: Dec. 27, 2001

(65) Prior Publication Data

US 2002/0127360 A1 Sep. 12, 2002

(30) Foreign Application Priority Data

Dec. 27, 2000 (JP) ...................................... 2000-399185

(51) Int. Cl.
*C08F 2/46* (2006.01)
*C08F 2/50* (2006.01)

(52) U.S. Cl. .................. 522/156; 522/150; 522/149; 522/153; 522/156; 522/155; 522/184; 522/185; 522/186; 522/187; 428/355 R; 428/355 A; 428/355 EN; 428/14; 428/442; 428/441

(58) Field of Classification Search ................ 522/149, 522/150, 153, 155, 156, 184, 185, 186, 187; 428/355 R, 355 A, 355 EN, 14, 442, 441
See application file for complete search history.

(56) References Cited

U.S. PATENT DOCUMENTS

| | | | | |
|---|---|---|---|---|
| 4,383,878 A | | 5/1983 | Young et al. | |
| 4,633,023 A | * | 12/1986 | Griffith et al. | 568/662 |
| 4,873,140 A | * | 10/1989 | McIntyre | 428/343 |
| 5,068,261 A | * | 11/1991 | Maruno et al. | 522/39 |
| 5,204,378 A | * | 4/1993 | Maruno et al. | 522/39 |
| 5,300,348 A | * | 4/1994 | Kubota et al. | 428/194 |
| 5,370,951 A | * | 12/1994 | Kubota et al. | 430/5 |
| 5,378,514 A | * | 1/1995 | Hamada et al. | 428/14 |
| 5,446,118 A | * | 8/1995 | Shen et al. | 526/245 |
| 5,643,654 A | * | 7/1997 | Fujita et al. | 428/138 |
| 5,690,863 A | * | 11/1997 | Schuman | 252/582 |
| 5,691,088 A | * | 11/1997 | Kubota et al. | 430/5 |
| 5,693,382 A | * | 12/1997 | Hamada et al. | 428/14 |
| 5,834,143 A | * | 11/1998 | Matsuoka et al. | 430/5 |
| 6,005,137 A | * | 12/1999 | Moore et al. | 560/139 |
| 6,221,988 B1 | * | 4/2001 | Mueller et al. | 526/243 |
| 6,288,266 B1 | * | 9/2001 | Moore et al. | 560/139 |
| 6,795,170 B2 | * | 9/2004 | Mishiro et al. | 355/75 |
| 6,869,733 B1 | * | 3/2005 | Su | 430/5 |
| 7,067,222 B2 | * | 6/2006 | Nagata | 430/5 |

FOREIGN PATENT DOCUMENTS

| | | | |
|---|---|---|---|
| JP | 63-248807 | * | 10/1988 |
| JP | 63-248807 A | | 10/1988 |
| JP | 03-163182 | * | 7/1991 |
| JP | 03-163182 A | | 7/1991 |
| JP | 04-28772 | * | 1/1992 |
| JP | 4-28772 A | | 1/1992 |
| JP | 04237055 A | * | 8/1992 |
| JP | 6-67409 | | 3/1994 |
| JP | 06-067409 | * | 3/1994 |
| JP | 6-148871 A | | 5/1994 |
| JP | 06186732 A | * | 7/1994 |
| JP | 07-056325 A | | 3/1995 |
| JP | 20011356473 | * | 12/2001 |

* cited by examiner

*Primary Examiner*—Sanza L McClendon
(74) *Attorney, Agent, or Firm*—Birch, Stewart, Kolasch & Birch, LLP

(57) ABSTRACT

A pellicle comprises a pellicle film and a pellicle frame for supporting the pellicle film, wherein the pellicle film is adhered to the pellicle frame through an adhesive layer comprising a fluorine-containing polymer and a substance resulting from curing of an ultraviolet-curing fluorine-containing monomer. A producing method of a pellicle including a pellicle film and a pellicle frame for supporting the pellicle film, comprises a step of adhering the pellicle film to the pellicle frame through an adhesive comprising a fluorine-containing polymer and an ultraviolet-curing fluorine-containing monomer.

20 Claims, No Drawings

PELLICLE, PRODUCING METHOD THEREOF AND ADHESIVE

BACKGROUND OF THE INVENTION

1. Field of the Invention

The present invention relates to a pellicle, a producing method thereof and an adhesive, and more particularly, to a pellicle used for a purpose of preventing dusts from attaching to a mask or a reticle (hereinafer referred simply to as mask or the like) used in the photolithography step in a process for producing an integrated circuit, to a process for producing a pellicle, and to an adhesive for pellicles.

2. Description of the Related Art

Based on the demand for rendering the line widths of integrated circuits finer, there is a request of using exposure light sources having extremely short wavelengths. When ultraviolet rays having such short wavelengths are used, the conventional pellicle films, such as cellulose, have severe degradation, and only insufficient durability is attained. Therefore, in recent years, pellicle films made of fluorine-containing polymers are used. However, practical adhesive strength was not attained using epoxy-based adhesives conventionally used for adhering pellicle films on pellicle frames due to the excellent detachabilities of the fluorine-containing polymers. Moreover, epoxy-based adhesives have only insufficient light resistance to the ultraviolet rays having short wavelengths.

In order to solve such problems about the adhesives for pellicle films made of fluorine-containing polymers, a pellicle comprising a pellicle film made of a fluorine-containing organic substance adhered to a pellicle frame with an adhesive made of the same fluorine-containing organic substance has also been proposed (Japanese Patent Application Laid-open No. 6-67409). However, if such a conventional adhesive is used, three-hour air-drying is required after the application of a solution comprising a fluorine-containing organic substance dissolved in an solvent to a frame, and additionally, when a film and an adhesive are adhered together, it is necessary to heat them to a temperature of 100° C. or higher. For this reason, the adhering process takes time and effort. Furthermore, since heat is applied, there is a problem that members, such as a frame, are distorted.

SUMMARY OF THE INVENTION

Therefore, a main object of the present invention is to provide an adhesive that has a sufficient light resistance to ultraviolet rays of short wavelengths, requires no heating at the time of adhering and exhibits a sufficient adhesive strength, a pellicle comprising an adhesive layer in which such an adhesive is used, and a process for producing such a pellicle.

According to a first aspect of the present invention, there is provided an adhesive comprising a fluorine-containing polymer and an ultraviolet-curing fluorine-containing monomer.

Further, according to a second aspect of the present invention, there is provided a pellicle comprising a pellicle film and a pellicle frame for supporting the pellicle film wherein the pellicle film is adhered to the pellicle frame through an adhesive layer comprising a fluorine-containing polymer and a substance resulting from curing of an ultraviolet-curing fluorine-containing monomer.

Still, furthermore, according to a third aspect of the present invention, there is provided a producing method of a pellicle including a pellicle film and a pellicle frame for supporting the pellicle film, comprising a step of adhering the pellicle film to the pellicle frame through an adhesive comprising a fluorine-containing polymer and an ultraviolet-curing fluorine-containing monomer.

The use of an adhesive containing an ultraviolet-curing fluorine-containing monomer as an adhesive for adhering a pellicle film to a pellicle frame makes it possible to adhere the pellicle film to the pellicle frame by polymerization-curing the fluorine-containing adhesive through ultraviolet irradiation. Therefore, it can simplify the process and can eliminate the necessity of heating at the time of adhering, and as a result, it makes it possible to effectively prevent a pellicle film from being damaged. Moreover, since not only an ultraviolet-curing fluorine-containing monomer but also a fluorine-containing polymer is contained in the adhesive, the adhesive strength of the adhesive can be further improved. Furthermore, since a fluorine-containing polymer and a substance resulting from the curing of an ultraviolet-curing fluorine-containing monomer are contained as an adhesive layer for adhering a pellicle film to a pellicle frame, it has a light resistance to the ultraviolet rays of short wavelengths.

It is desirable that the pellicle film adhered with the above-mentioned adhesive comprises a fluorine-containing polymer. If the above-mentioned adhesive containing a fluorine-containing polymer and an ultraviolet-curing fluorine-containing monomer is used for adhering a pellicle film comprising a fluorine-containing polymer to a pellicle frame, it becomes possible to improve the adhesiveness of the pellicle film comprising a fluorine-containing polymer.

It is desirable that the fluorine-containing polymer contained in the adhesive is a copolymer comprising structural units represented by the following formulas (4), (5), and (6).

$$—C_2F_4— \quad (4)$$

$$—C_3H_6— \quad (5)$$

$$—C_2H_2F_2— \quad (6)$$

The desirable molecular weight of the fluorine-containing polymer used for the adhesive is a molecular weight such that a limiting viscosity [η] is 0.20 to 0.80 (dl/g). Here, with respect to the measurement conditions of the limiting viscosity [η], the solvent is THF and the temperature is 30° C. If the limiting viscosity [η] is too high (that is, if the molecular weight is too great), when the film is adhered, the spreadability of the adhesive on a frame becomes poor and it becomes difficult to adhere a film with good appearance. On the contrary, if the limiting viscosity is too low (that is, the molecular weight is too small), the strength of the adhesive after curing becomes poor and the adhesive layer is distorted by the tension of the film.

More preferably, this copolymer is a fluorine polymer represented by the following formula (7) wherein each of a, b and c is a positive integer and, still more preferably, it is 1,1-difluoroethylene.teluoroethylene.propylene copolymer, where [η]=0.30–0.45 (dl/g).

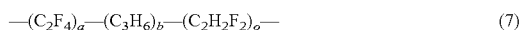
$$—(C_2F_4)_a—(C_3H_6)_b—(C_2H_2F_2)_c— \quad (7)$$

It is desirable that the ultraviolet-curing fluorine-containing monomer preferably contained in the adhesive used for adhering a pellicle film to a pellicle frame is preferably a (meta) acrylic ester of a fluorine-containing monomer or a fluorine-containing monomer having a hydroxyl group. At least one kind of monomer selected from the group consisting of general formulas (1), (2) and (3)

presented below can be suitably used, in the formulas, $R^1$ and $R^4$ each independently representing hydrogen or a methyl group, $R^2$ and $R^3$ each independently representing hydrogen or a hydroxyl group, Rf being a fluorine-containing group, and l, m and n each being an integer.

  (1)

  (2)

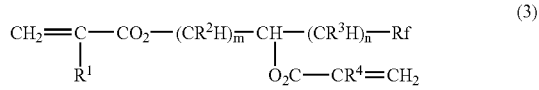  (3)

The desirable ratio between the fluorine-containing polymer and the ultraviolet-curing fluorine-containing monomer contained in an adhesive is fluorine-containing polymer:ultraviolet-curing fluorine-containing monomer=1:0.25 to 0.5 (weight ratio) in the case of monoacrylate fluorine-containing monomer represented by general formula (2); and fluorine-containing polymer:ultraviolet-curing fluorine-containing monomer=1:0.25 to 3 (weight ratio) in the case of diacrylate fluorine-containing monomer represented by general formula (3) or (4). If there are too much fluorine-containing monomer, the adhesive strength will become low. Conversely, if there is a too small amount of fluorine-containing monomer, when the film is adhered, the spreadability of the adhesive on a flame becomes poor and it becomes difficult to adhere a film with good appearance.

In the ultraviolet-curing fluorine-containing monomer represented by general formula (1) (in the formula, $R^1$ is hydrogen or a methyl group, $R^2$ is hydrogen or a hydroxyl group, Rf is a fluorine-containing group, and l is an integer) presented below among the ultraviolet-curing fluorine-containing monomers preferably contained in the adhesive layer used for adhering a pellicle film to a pellicle frame, l is preferably an integer of 1 to 8. The fluorine-containing group Rf may preferably be $-(CF_2)CF_3$, $-(CF_2)_7CF_3$, $-(CF_2)_3CF_3$, $-(CF_2)_2CF(CF_3)_2$, $-(CF_3)_2$, $-(CF_2)_3CF_2H$, $-(CF_2)_9CF_3$, $-(CF_2)_8CF(CF_3)_2$ or the like.

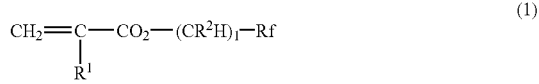  (1)

The ultraviolet-curing fluorine-containing monomer represented by general formula (1) is specifically exemplified by the following fluorine-containing monomers.

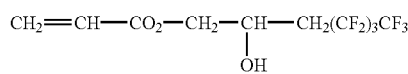

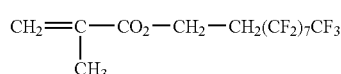

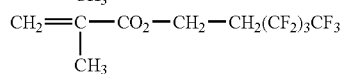

-continued

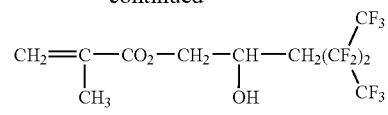

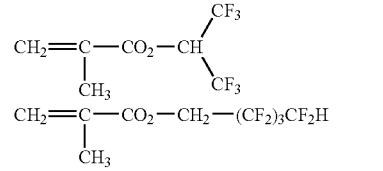

$CH_2=CH-CO_2-CH_2-CH_2-(CF_2)_9CF_3$

$CH_2=CH-CO_2-CH_2(CF_2)_4CH_2OH$

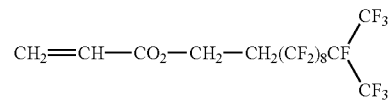

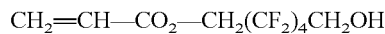

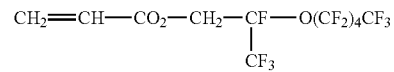

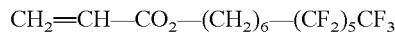

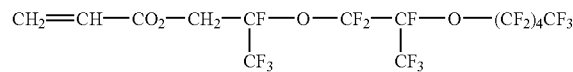

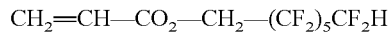

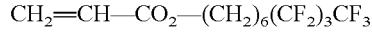

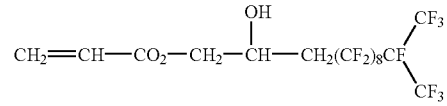

In the ultraviolet-curing fluorine-containing monomer represented by general formula (2) (in the formula, $R^1$ and $R^4$ each independently representing hydrogen or a methyl group, $R^2$ and $R^3$ each independently representing hydrogen or a hydroxyl group, Rf being a fluorine-containing group, and m and n each being an integer) presented below among the ultraviolet-curing fluorine-containing monomers preferably contained in the adhesive layer used for adhering a pellicle film to a pellicle frame, m is preferably an integer of 1 to 8 and n is preferably an integer of 1 to 8. The fluorine-containing group Rf may preferably be $-CF_2-$, $-(CF_2)_2-$, $-(CF_2)_4-$, $-(CF_2)_6-$, $-(CF_2)_8-$, $-CFCF_3-$, $-(CF_2)_2CFCF_3-$, $-(CF_2)_4CFCF_3-$, $-(CF_2)_6CFCF_3-$ or the like.

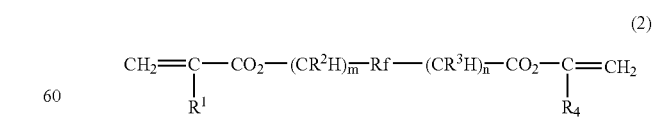  (2)

The ultraviolet-curing fluorine-containing monomer represented by general formula (2) is specifically exemplified by the following fluorine-containing monomers.

$CH_2=CH-CO_2-CH_2-(CF_2)_2-CH_2-CO_2-CH=CH_2$ $CH_2=CH-CO_2-CH_2-(CF_2)_4-CH_2-CO_2-CH=CH_2$ $CH_2=CH-CO_2-CH_2-(CF_2)_6-CH_2-CO_2-CH=CH_2$ $CH_2=CH-CO_2-CH_2-(CF_2)_8-CH_2-CO_2-CH=CH_2$ $CH_2=CH-CO_2-(CH_2)_n-(CF_2)_4-(CH_2)_m-CO_2-CH=CH_2$ (n and m are respectively 1 to 3)

$CH_2=C(CH_3)-CO_2-(CH_2)_n-(CF_2)_4-(CH_2)_m-CO_2-CH=CH_2$ (n and m are respectively 1 to 3)

$CH_2=C(CH_3)-CO_2-(CH_2)_n-(CF_2)_4-(CH_2)_m-CO_2-C(CH_3)=CH_2$ (n and m are respectively 1 to 3)

$CH_2=CH-CO_2-CH(OH)-(CF_2)_4-(CH)_n-CO_2-CH=CH_2$ (n is 1 to 3)

In the ultraviolet-curing fluorine-containing monomer represented by general formula (3) (in the formula, $R^1$ and $R^4$ each independently representing hydrogen or a methyl group, $R^2$ and $R^3$ each independently representing hydrogen or a hydroxyl group, Rf being a fluorine-containing group, and m and n each being an integer) presented below among the ultraviolet-curing fluorine-containing monomers preferably contained in the adhesive layer used for adhering a pellicle film to a pellicle frame, m is preferably an integer of 1 to 8 and n is preferably an integer of 1 to 8. The fluorine-containing group Rf may preferably be $-(CF_2)CF_3$, $-(CF_2)_7CF_3$, $-(CF_2)_3CF_3$, $-(CF_2)_2CF(CF_3)_2$, $-(CF_3)_2$, $-(CF_2)_3CF_2H$, $-(CF_2)_9CF_3$, $-(CF_2)_8CF(CF_3)_2$ or the like.

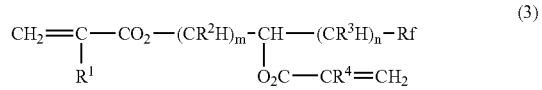

The ultraviolet-curing fluorine-containing monomer represented by general formula (3) is specifically exemplified by the following fluorine-containing monomers.

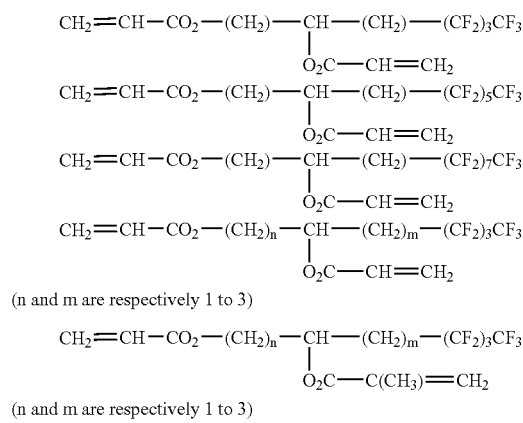

(n and m are respectively 1 to 3)

(n and m are respectively 1 to 3)

In the adhesive used for adhering a pellicle film to a pellicle frame, a photoinitiator or a sensitizer can be used together with the aforementioned fluorine-containing polymer and ultraviolet-curing fluorine-containing monomer. The use of these agents makes the polymerization-curing caused by ultraviolet rays proceed rapidly and also increases the degree of polymerization so that it can improve the adhesive strength.

As the photoinitiator, 2,2-diethoxyacetophenone, Darocur 1173 (manufactured by Ciba Specialty Chemicals K.K.), Irgacure 369 (manufactured by Ciba Specialty Chemicals K.K.), Irgacure 819 (manufactured by Ciba Specialty Chemicals K.K.), Irgacure 1700 (manufactured by Ciba Specialty Chemicals K.K.), Irgacure 1850 (manufactured by Ciba Specialty Chemicals K.K.) and Irgacure 184 (manufactured by Ciba Specialty Chemicals K.K.) are preferably used.

Preparation of Adhesive

As the sensitizer, benzoin, benzoin ethyl ether and benzoin isopropyl ether can be used suitably.

Pellicle Film

Preferably, a pellicle film used for a pellicle is that comprising a fluorine-containing polymer, and, is specifically exemplified by a fluorine polymer manufactured by Asahi Glass Company (trade name: CYTOP), a fluorine polymer manufactured by E. I. du Pont de Nemours and Company (trade name: Teflon AF), etc.

The production of the pellicle film comprising a fluorine-containing polymer can be carried out by dissolving the above-mentioned fluorine-containing polymer using a fluorine-containing solvent, especially a perfluoro organic solvent such as perfluoro (2-butyltetrahydrofuran), perfluoro (2-propyltetrahydropyran), perfluorohydrofuran and perfluorooctane, so that the concentration of the polymer becomes 0.1 to 20% by weight, especially 0.3 to 10% by weight, and then coating the solution by a known cast film formation method such as the spin coat method and the knife coat method. It is generally recommended to cast a resin solution on a surface of a smooth substrate such as a glass plate to form a thin film and then dry it by means of hot air or infrared irradiation to remove the residual solvent. The thickness of the thin film formed can be easily changed by changing the viscosity of the solution, the rotating speed of the substrate, etc. It is generally recommended to set the thickness of a thin film so that the permeability to the wavelength of the light source used within the range of from 0.05 to 10 μm becomes high.

Moreover, a pellicle film comprising a thin film made of a conventionally known pellicle film material such as nitrocellulose and an antireflection layer made of a fluorine-containing polymer laminated on the thin film can also be used suitably as well as the pellicle film made of a fluorine-containing polymer.

Also in this case, even if the part coming into contact with an adhesive is the antireflection layer made of the fluorine-containing polymer, the above-mentioned adhesive containing a fluorine-containing polymer and an ultraviolet-curing fluorine-containing monomer shows an excellent adhesiveness and it is possible to obtain an effect the same as in the case of adhering a pellicle film made of a fluorine-containing polymer.

Pellicle Frame

All the known pellicle frames can be used as a pellicle frame, and that made of metals such as aluminum, aluminum alloy and stainless steel, that made of synthetic resin and that made of ceramic can be preferably used.

Moreover, adhering a pellicle film to one side of the pellicle frame through the aforementioned adhesive and applying an adhesive or sticking a double-sided tape to the other side make the pellicle of the present invention possible to be attached onto a mask or the like.

DESCRIPTION OF THE PREFERRED EMBODIMENTS

FIRST EXAMPLE

Preparation of a Pellicle Film

A 6-wt % solution was prepared by dissolving a completely fluorinated fluorine-containing resin, CYTOP (trade name, manufactured by Asahi Glass Company) in a fluorine-containing solvent, IL-263 (perfluorotrialkylamine (chemical formula: $C_nF_{2n+1})_3N$) (manufactured by Tokuyama Corp. trade name) and then a thin film of 0.8 μm in thickness was formed using a spin coat method.

Preparation of Adhesive

In 1,1-difluoroethylene.tetrafluoroethylene. propylene copolymer (manufactured by Asahi Glass Company) (limiting viscosity: [η]=0.30 to 0.45 (dl/g)), butyl acetate and 2-(perfluorooctyl) ethyl acrylate (R-1820 manufactured by Daikin Fine Chemical Laboratory, trade name) were added and dissolved. Then, an adhesive was prepared by adding Darocur 1173 (manufactured by Ciba Specialty Chemicals K.K.), Irgacure 369 (manufactured by Ciba Specialty Chemicals K.K.) and 2,2-diethoxyacetophenone (manufactured by Wako Pure Chemical Industries, Ltd.) as photoinitiators. Refer to Table 1 for the composition.

Preparation of Pellicle

Onto an adhesion surface of a pellicle frame (149 mm in length, 122 mm in breadth, 5.8 mm in height and 2 mm in width) made of an aluminum alloy, an adhesive discharged from an application needle having an outer diameter of 2.0 mmϕ and an inner diameter of 1.0 mmϕ at a discharging rate of 16 sec/5 drops was applied at an application speed of 20 mm/second.

The pellicle film formed was adhered 60 seconds after the completion of the application. After that, the pellicle film was irradiated using a UV irradiation device (manufactured by TOSHIBA LIGHTING & TECHNOLOGY CORPORATION; M2000L/81N (80 W/cm); spectral range: 220 to 600 nm) for 90 seconds, and thus, the adhesive was cured. Subsequently, the excessive film extending outside the pellicle frame was cut away with a cutter so that a pellicle was prepared.

(Adhesive Strength, Appearance Evaluation and Light Resistance of Pellicle Film)

Evaluation (outwardly-blowing evaluation) was conducted by using a needle 1.0 mmϕ in outer diameter and 0.65 mmϕ in inner diameter and blowing an air having a pressure of 0.2 MPa, at a speed of about 2 mm/second, from a position 10 mm away from the front face of a thin film, at an angle of 65°, along the inside of the pellicle frame having the thin film adhered thereon. In the same manner, evaluation (inwardly-blowing evaluation) was conducted by blowing an air having a pressure of 0.2 MPa, at a speed of about 2 mm/second, from a position 10 mm away from the rear face of the thin film, at an angle of 45°, along the inside of the pellicle frame having the thin film adhered thereon. Moreover, the appearance was evaluated with a microscope under a fluorescent lamp. Furthermore, the light resistance was evaluated by irradiating an adhesion surface with ArF laser (wavelength: 193 nm, 1 (mJ/cm$^2$)/pulse, 500 Hz) in the amount of 3000 J. The results are summarized in Table 1.

TABLE 1

(Evaluation Results 1)

| | adhesive composition (wt %) | | | | adhesive strength evaluation | | | | |
|---|---|---|---|---|---|---|---|---|---|
| No. | fluorine-containing polymer*1 | R-1820 | butyl acetate | 1173/369/diethoxyacetophenone*2 | outwardly-blowing | inwardly-blowing | appearance evaluation | light resistance*3 | comprehensive evaluation |
| 1 | 17.0 | 8.5 | 74.2 | 0.3/0/0 | no peeling | no peeling | no film cramp problem no irregularity in the film | no irregularity | ○ |
| 2 | 17.0 | 4.3 | 78.6 | 0.1/0/0 | no peeling | no peeling | no film cramp problem no irregularity in the film | no irregularity | ○ |
| 3 | 17.0 | 8.5 | 73.9 | 0.6/0/0 | no peeling | no peeling | no film cramp problem no irregularity in the film | no irregularity | ○ |
| 4 | 17.0 | 8.5 | 73.9 | 0/0.6/0 | no peeling | no peeling | no film cramp problem no irregularity in the film | no irregularity | ○ |
| 5 | 17.0 | 8.5 | 73.9 | 0/0/0.6 | no peeling | no peeling | no film cramp problem no irregularity in the film | no irregularity | ○ |
| 6 | 17.0 | 8.5 | 73.9 | 0.3/0.3/0 | no peeling | no peeling | no film cramp problem no irregularity in the film | no irregularity | ○ |
| 7 | 17.0 | 8.5 | 73.9 | 0.2/0.2/0.2 | no peeling | no peeling | no film cramp problem no irregularity in the film | no irregularity | ○ |
| 8 | 17.0 | 8.5 | 73.9 | 0/0.3/0.3 | no peeling | no peeling | no film cramp problem no irregularity in the film | no irregularity | ○ |

*1 1, 1-difluoroethlene · teltrafluoroethylene · propylene copoylmer
*2 1173:Darocur 1173, 369:Iracure 369, diethoxyacetophenone:2.2 diethoxyacetophenone
*3 The light resistance was evaluated by irradiating an adhesion surface with ArF laser (1 mj, 500 Hz) in the amount of 3000 J.

The results in Table 1 show that the aforementioned adhesive can adhere a frame and a film strongly, rapidly and with good appearance by irradiation of ultraviolet light after the application of the adhesive to the pellicle frame. The light resistance was also found to be excellent.

In "Appearance evaluation" in Table 1, "no film cramp problem" refers to the case where a slight clamp that does not cause any problem in practical use is observed in appearance. The case where the evaluation "no film cramp problem is not found" is the case where no cramp was observed. "There was no irregularity in the film" indicates that there are no irregularities such as discoloration of the film and is the evaluation about whether the film itself was affected or not. These apply to Table 2 or later.

Moreover, also in the following Examples and Comparative Examples, the formation of a pellicle film and evaluations of adhesive strength and appearance of the pellicle film were conducted in the same manner as Example 1. Therefore, the details about these items are omitted in the following Examples and Comparative Examples.

SECOND EXAMPLE

Preparation of Adhesive

In 1,1-difluoroethylene.tetrafluoroethylene. propylene copolymer (manufactured by Asahi Glass Company), butyl acetate and 1H, 1H, 5H-octafluoropentyl acrylate (R-5410: manufactured by Daikin Fine Chemical Laboratory, trade name) were added and dissolved. Then, an adhesive was prepared by adding Darocur 1173 (manufactured by Ciba Specialty Chemicals K.K.), Irgacure 369 (manufactured by Ciba Specialty Chemicals K.K.) and 2,2-diethoxyacetophenone (manufactured by Wako Pure Chemical Industries, Ltd.) as photoinitiators. Refer to Table 2 for the composition.

Preparation of Pellicle

Onto an adhesion surface of a pellicle frame (149 mm in length, 122 mm in breadth, 5.8 mm in height and 2 mm in width) made of an aluminum alloy, an adhesive discharged from an application needle having an outer diameter of 2.0 mm$\phi$ and an inner diameter of 1.0 mm$\phi$ at a discharging rate of 16 sec/5 drops was applied at an application speed of 20 mm/second.

The pellicle film formed was adhered 60 seconds after the completion of the application. After that, the pellicle film was irradiated using a UV irradiation device (manufactured by TOSHIBA LIGHTING & TECHNOLOGY CORPORATION; M2000L/81N (80 W/cm); spectral range: 220 to 600 nm) for 90 seconds, and thus, the adhesive was cured. Subsequently, the excessive film extending outside the pellicle frame was cut away with a cutter so that a pellicle was prepared.

(Adhesive strength, appearance evaluation and light resistance of pellicle film)

The results are summarized in Table 2.

TABLE 2

(Evaluation Results 2)

| No. | adhesive composition (wt %) | | | | adhesive strength evaluation | | appearance evaluation | light resistance[3] | comprehensive evaluation |
|---|---|---|---|---|---|---|---|---|---|
| | fluorine-containing polymer[1] | R-5410 | butyl acetate | 1173/369/diethoxyacetophenone[2] | outwardly-blowing | inwardly-blowing | | | |
| 9 | 17.0 | 8.5 | 74.2 | 0.3/0/0 | no peeling | no peeling | no film cramp problem no irregularity in the film | no irregularity | ○ |
| 10 | 17.0 | 4.3 | 78.6 | 0.1/0/0 | no peeling | no peeling | no film cramp problem no irregularity in the film | no irregularity | ○ |
| 11 | 17.0 | 8.5 | 73.9 | 0.6/0/0 | no peeling | no peeling | no film cramp problem no irregularity in the film | no irregularity | ○ |
| 12 | 17.0 | 8.5 | 73.9 | 0/0.6/0 | no peeling | no peeling | no film cramp problem no irregularity in the film | no irregularity | ○ |
| 13 | 17.0 | 8.5 | 73.9 | 0/0/0.6 | no peeling | no peeling | no film cramp problem no irregularity in the film | no irregularity | ○ |
| 14 | 17.0 | 8.5 | 73.9 | 0.3/0.3/0 | no peeling | no peeling | no film cramp problem no irregularity in the film | no irregularity | ○ |
| 15 | 17.0 | 8.5 | 73.9 | 0.2/0.2/0.2 | no peeling | no peeling | no film cramp problem no irregularity in the film | no irregularity | ○ |
| 16 | 17.0 | 8.5 | 73.9 | 0/0.3/0.3 | no peeling | no peeling | no film cramp problem no irregularity in the film | no irregularity | ○ |

[1] 1, 1-difluoroethlene · tetrafluoroethylene · propylene copoylmer
[2] 1173:Darocur 1173, 369:Iracure 369, diethoxyacetophenone:2.2 diethoxyacetophenone
[3] The light resistance was evaluated by irradiating an adhesion surface with ArF laser (1 mJ, 500 Hz) in the amount of 3000 J.

The results in Table 2 show that the aforementioned adhesive can adhere a frame and a film strongly, rapidly and with good appearance by irradiation of ultraviolet light after the application of the adhesive to the pellicle frame.

THIRD EXAMPLE

Preparation of Adhesive 2,2,3,3,4,4,5,5-octafluorohexane-1,6-diacrylate (hereafter referred to as DR7412) was synthesized by esterifying 2,2,3,3,4,4,5,5-octafluorohexane-1,6-diol (A-7412; manufactured by Daikin Fine Chemical Laboratory; trade name). Thereafter, in 1,1-difluoroethylene. tetrafluoroethylene.propylene copolymer (manufactured by Asahi Glass Company), butyl acetate and the synthesized DR7412 were added and dissolved. Then, an adhesive was prepared by adding Darocur 1173 (manufactured by Ciba Specialty Chemicals K.K.), Irgacure 369 (manufactured by Ciba Specialty Chemicals K.K.) and 2,2-diethoxyacetophenone (manufactured by Wako Pure Chemical Industries, Ltd.) as photoinitiators. Refer to Table 3 for the composition.

Preparation of Pellicle

Onto an adhesion surface of a pellicle frame (149 mm in length, 122 mm in breadth, 5.8 mm in height and 2 mm in width), an adhesive discharged from an application needle having an outer diameter of 2.0 mmϕ and an inner diameter of 1.0 mmϕ at a discharging rate of 16 sec/5 drops was applied at an application speed of 20 mm/second.

The pellicle film formed was adhered 60 seconds after the completion of the application. After that, the pellicle film was irradiated using a UV irradiation device (manufactured by TOSHIBA LIGHTING & TECHNOLOGY CORPORATION; M2000L/81N (80 W/cm); spectral range: 220 to 600 nm) for 90 seconds, and thus, the adhesive was cured. Subsequently, the excessive film extending outside the pellicle frame was cut away with a cutter so that a pellicle was prepared.

(Adhesive Strength, Appearance Evaluation and Light Resistance of Pellicle Film)

The results are summarized in Table 3.

TABLE 3

(Evaluation Results 3)

| | adhesive composition (wt %) | | | | adhesive strength evaluation | | | | |
|---|---|---|---|---|---|---|---|---|---|
| No. | fluorine-containing polymer*1 | DR-7412 | ethyl acetate | 1173/369/diethoxyacetophenone*2 | outwardly-blowing | inwardly-blowing | appearance evaluation | light resistance*3 | comprehensive evaluation |
| 17 | 12.0 | 36.0 | 49.8 | 2.2/0/0 | no peeling | no peeling | no irregularity in the film | no irregularity | ○ |
| 18 | 22.0 | 44.0 | 31.4 | 2.6/0/0 | no peeling | no peeling | no irregularity in the film | no irregularity | ○ |
| 19 | 22.0 | 33.0 | 43.0 | 2.0/0/0 | no peeling | no peeling | no irregularity in the film | no irregularity | ○ |
| 20 | 22.0 | 22.0 | 54.7 | 1.3/0/0 | no peeling | no peeling | no film cramp problem no irregularity in the film | no irregularity | ○ |
| 21 | 17.0 | 8.5 | 74.2 | 0.3/0/0 | no peeling | no peeling | no film cramp problem no irregularity in the film | no irregularity | ○ |
| 22 | 17.0 | 4.3 | 78.6 | 0.1/0/0 | no peeling | no peeling | no film cramp problem no irregularity in the film | no irregularity | ○ |
| 23 | 22.0 | 33.0 | 42.0 | 3.0/0/0 | no peeling | no peeling | no irregularity in the film | no irregularity | ○ |
| 24 | 22.0 | 33.0 | 44.0 | 1.0/0/0 | no peeling | no peeling | no irregularity in the film | no irregularity | ○ |
| 25 | 22.0 | 33.0 | 43.0 | 0/0/2.0 | no peeling | no peeling | no irregularity in the film | no irregularity | ○ |
| 26 | 22.0 | 33.0 | 43.0 | 1.0/1.0/0 | no peeling | no peeling | no irregularity in the film | no irregularity | ○ |
| 27 | 22.0 | 33.0 | 43.0 | 0/1.0/1.0 | no peeling | no peeling | no irregularity in the film | no irregularity | ○ |
| 28 | 22.0 | 33.0 | 42.9 | 0.7/0.7/0.7 | no peeling | no peeling | no irregularity in the film | no irregularity | ○ |

*1 1, 1-difluoroethlene · teltrafluoroethylene · propylene copoilymer
*2 1173:Darocur 1173, 369:Iracure 369, diethoxyacetophenone:2.2 diethoxyacetophenone
*3 The light resistance was evaluated by irradiating an adhesion surface with ArF laser (1 mj, 500 Hz) in the amount of 3000 J.

The results in Table 3 show that the aforementioned adhesive can adhere a frame and a film strongly, rapidly and with good appearance by irradiation of ultraviolet light after the application of the adhesive to the pellicle frame.

COMPARATIVE EXAMPLE 1

Preparation of Adhesive

An adhesive was prepared by adding butyl acetate as a solvent to an ultraviolet-curing adhesive not being any fluorine-containing monomer, 3083 (manufactured by Three Bond, Co., Ltd.). Refer to Table 4 for the composition of this adhesive.

Preparation of Pellicle

Onto an adhesion surface of a pellicle frame (149 mm in length, 122 mm in breadth, 5.8 mm in height and 2 mm in width) made of an aluminum alloy, an adhesive discharged from an application needle having an outer diameter of 0.7 mmϕ and an inner diameter of 0.3 mmϕ at a discharging rate of 30 sec/5 drops was applied at an application speed of 20 mm/second.

The pellicle film formed was adhered 60 seconds after the completion of the application. After that, the pellicle film was irradiated using a UV irradiation device (manufactured by TOSHIBA LIGHTING & TECHNOLOGY CORPORATION; M2000L/81N (80 W/cm); spectral range: 220 to 600 nm) for 70 seconds, and thus, the adhesive was cured. Subsequently, the excessive film extending outside the pellicle frame was cut away with a cutter so that a pellicle was prepared.
(Adhesive Strength, Appearance Evaluation and Light Resistance of Pellicle Film)

The results are summarized in Table 4.

width) made of an aluminum alloy, an adhesive discharged from an application needle having an outer diameter of 0.7 mm$\phi$ and an inner diameter of 0.3 mm$\phi$ at a discharging rate of 30 sec/5 drops was applied at an application speed of 20 mm/second.

The pellicle film formed was adhered 60 seconds after the completion of the application. After that, the pellicle film was irradiated using a UV irradiation device (manufactured by TOSHIBA LIGHTING & TECHNOLOGY CORPORA-

TABLE 4

(Evaluation Results 4)

| No. | adhesive composition (wt %) | | adhesive strength evaluation | | appearance evaluation | light resistance*3 | comprehensive evaluation |
|---|---|---|---|---|---|---|---|
| | 3083 | butyl acetate | outwardly-blowing | inwardly-blowing | | | |
| 29 | 100 | 0 | peeling was observed | peeling was observed | no irregularity in the film | discoloration was observed | X |
| 30 | 60 | 40 | peeling was observed | peeling was observed | no irregularity in the film | discoloration was observed | X |
| 31 | 40 | 60 | peeling was observed | peeling was observed | no irregularity in the film | discoloration was observed | X |

*1 The light resistance was evaluated by irradiating an adhesion surface with ArF laser (1 mJ. 500 Hz) in the amount of 3000 J.

The results summarized in Table 4 show that in the case of the aforementioned adhesive, rapid adhesion with good appearance was achieved, but only insufficient adhesive strength was attained. Further, the results also show that there is a light resistance problem.

COMPARATIVE EXAMPLE 2

Adhesive

A pellicle was prepared using Three Bond 3013C (manufactured by Three Bond, Co., Ltd.; trade name).
Preparation of Pellicle Onto an adhesion surface of a pellicle frame (149 mm in length, 122 mm in breadth, 5.8 mm in height and 2 mm in TION; M2000L/81N (80 W/cm); spectral range: 220 to 600 nm) for 90 seconds, and was heated for 10 minutes using a hot air dryer at 120° C. Thus, the adhesive was cured. Subsequently, the excessive film extending outside the pellicle frame was cut away with a cutter so that a pellicle was prepared.

(Adhesive Strength, Appearance Evaluation and Light Resistance of Pellicle Film)

The results are summarized in Table 5.

TABLE 5

(Evaluation Results 4)

| No. | adhesive composition (wt %) | adhesive strength evaluation | | appearance evaluation | light resistance*3 | comprehensive evaluation |
|---|---|---|---|---|---|---|
| | Three Bond 3013C | outwardly-blowing | inwardly-blowing | | | |
| 32 | 100 | peeling was observed | peeling was observed | film was discolored near the frame. resulting in color heterogeneity | diacoloration was observed | X |

*1 The light resistance was evaluated by irradiating an adhesion surface with ArF laser (1 mJ. 500 Hz) in the amount of 3000 J.

The results in Table 5 show that in the case of the aforementioned adhesive since there is a necessity of applying a high temperature for adhering the objects, the film was damaged. Further, only insufficient adhesive strength was attained. Still further, the results also show that there is a light resistance problem.

COMPARATIVE EXAMPLE 3

Preparation of Adhesive

CYTOP CTX type-A (manufactured by Asahi Glass Company; trade name) was dissolved in a solvent CTsolv160 (perfluorotrialkylamine (chemical formula: $C_nF_{2n+1})_3N$) (manufactured by Asahi Glass Company; trade name) and the concentration was adjusted to 9% by weight.

Preparation of Pellicle

Onto an adhesion surface of a pellicle frame (149 mm in length, 122 mm in breadth, 5.8 mm in height and 2 mm in width) made of aluminum alloy, an adhesive discharged from an application needle having an outer diameter of 2.0 mmϕ and an inner diameter of 1.0 mmϕ at a discharging rate of 16 sec/5 drops was applied at an application speed of 20 mm/second.

After the hot-air drying for 3 hours was conducted after the completion of the application, this aluminum frame was put on a 130° C. hot plate with the adhesive application surface up, and 5 minutes after, the film formed was put on the adhesive application surface to be adhered. Subsequently, the excessive film extending outside the pellicle frame was cut away with a cutter so that a pellicle was prepared.

(Adhesive strength, appearance evaluation and light resistance of pellicle film)

The results are summarized in Table 6.

TABLE 6

(Evaluation Results 6)

| No. | adhesive composition (wt %) | | adhesive strength -evaluation | | appearance evaluation | light resistance*3 | comprehensive evaluation |
|---|---|---|---|---|---|---|---|
| | CYTOP | CTsolv 160 | outwardly-blowing | inwardly-blowing | | | |
| 33 | 9 | 91 | no peeling | no peeling | film was discolored near the frame, resulting in Color heterogeneity | no irregularity | X |

*1 The light resistance was evaluated by irradiating an adhesion surface with ArF laser (1 mJ. 500 Hz) in the amount of 3000 J.

The results in Table 6 show that in the case of the aforementioned adhesive since there is a necessity of applying a high temperature for adhering the objects, the film was damaged. Further, much time and work were required for preparing a pellicle.

The entire disclosure of Japanese Patent Application No. 2000-399185 filed on Dec. 27, 2000 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A pellicle comprising a pellicle film made of a fluorine-containing polymer and a pellicle frame for supporting the pellicle film wherein, the pellicle film is adhered to the pellicle frame through an adhesive layer comprising a fluorine-containing polymer and a substance resulting from curing of an ultraviolet-curing fluorine-containing monomer, wherein the ultraviolet-curing fluorine-containing monomer comprises a monomer represented by general formula

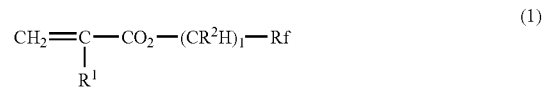

wherein $R^1$ represents hydrogen or a methyl group, $R^2$ represents hydrogen of a hydroxyl group, Rf is a fluorine-containing group, and is an integer of 1 to 8, and the fluorine-containing polymer of said adhesive is a copolymer comprising structural units represented by the following formulas (4), (5), and (6):

2. A method for producing a pellicle including a pellicle film made of a fluorine-containing polymer and a pellicle frame for supporting the pellicle film, comprising adhering the pellicle film to the pellicle frame through an adhesive comprising a fluorine-containing polymer and an ultraviolet-curing fluorine- containing monomer, wherein the ultraviolet-curing fluorine-containing monomer comprises a monomer represented by general formula (1):

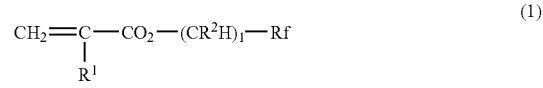

wherein $R^1$ represents hydrogen of a methyl group, $R^2$ represents hydrogen or a hydroxyl group, Rf is a fluorine-containing group, and is an integer of 1 to 8 , and the fluorine-containing polymer of said adhesive is a copolymer comprising structural units represented by the following formulas (4), (5), and (6):

3. The pellicle as recited in claim 1, wherein the fluorine-containing polymer of said adhesive is a copolymer comprising structural units represented by formula (7):

$$-(C_2F_4)_a-(C_3H_6)_b-(C_2H_2F_2)_c- \qquad (7)$$

wherein each of a, b and c is a positive integer.

4. The method as recited in claim 2, wherein the fluorine-containing polymer of said adhesive is a copolymer comprising structural units represented by formula (7):

$$-(C_2F_4)_a-(C_3H_6)_b-(C_2H_2F_2)_c- \qquad (7)$$

wherein each of a, b and c is a positive integer.

5. The pellicle as recited in claim 1, wherein the ratio between the fluorine-containing polymer of said adhesive and the ultraviolet-curing fluorine-containing monomer contained in the adhesive layer is fluorine-containing polymer: ultraviolet curing fluorine-containing monomer =17.4:3 to 8.5 weight ratio) in the case of monoacrylate fluorine-containing monomer represented by general formula (1).

6. The method as recited in claim 2, wherein the ratio between the fluorine-containing polymer of said adhesive and the ultraviolet-curing fluorine-containing monomer contained in the adhesive layer is fluorine-containing polymer:ultraviolet-curing fluorine-containing monomer =17.4.3 to 8.5(weight ratio) in the case of monoacrylate fluorine-containing monomer represented by general formula (1).

7. The pellicle as recited in claim 1, wherein the ultraviolet-curing fluorine-containing monomer represented by general formula (1) is at least one selected from the group consisting of:

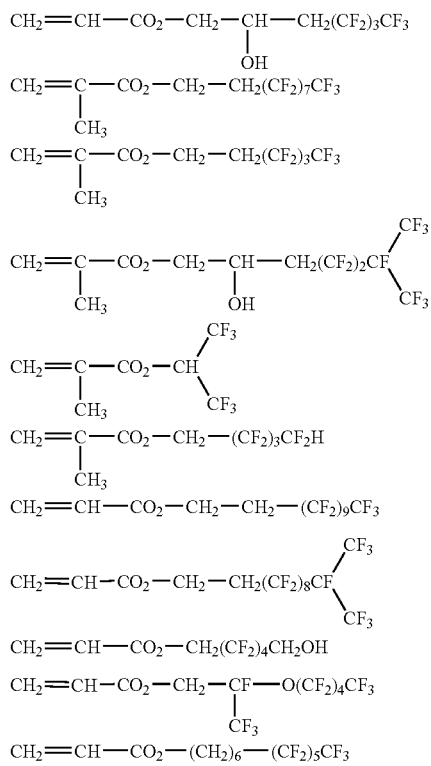

-continued

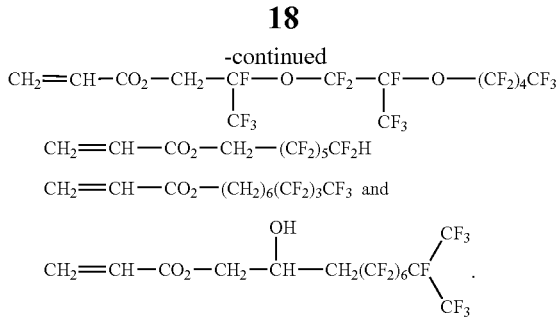

8. The method as recited in claim 2, wherein the ultraviolet-curing fluorine-containing monomer represented by general formula 1) is at least one selected from the group consisting of:

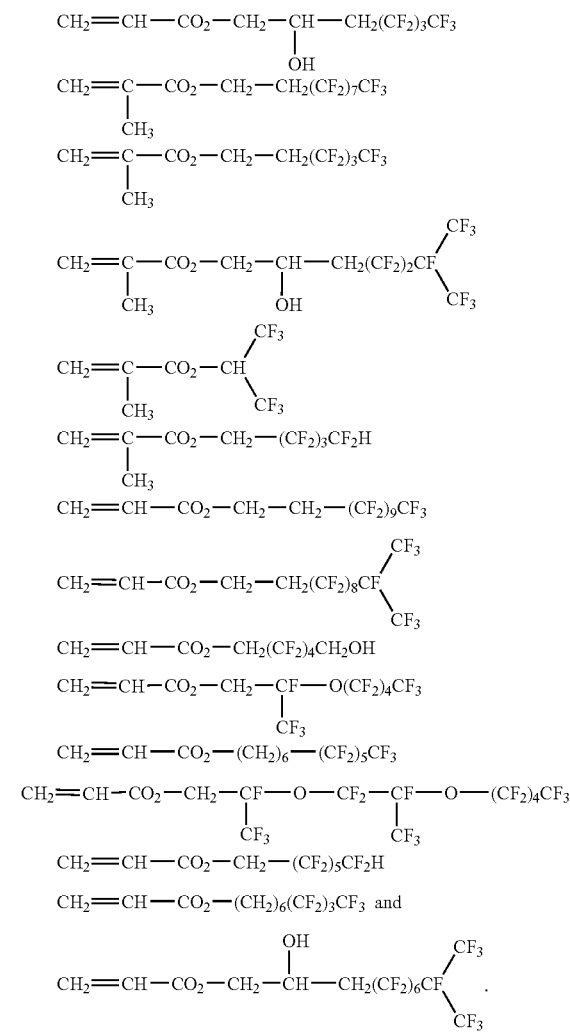

9. The pellicle as recited in claim 1, wherein in the ultraviolet curing fluorine -containing monomer according to general formula $R^1$ represents a methyl group.

10. The pellicle as recited in claim 2, wherein in the ultraviolet-curing fluorine-containing monomer according to general formula $R^1$ represents a methyl group.

11. A pellicle comprising a pellicle film made of a fluorine-containing polymer and a pellicle frame for supporting the pellicle film, wherein
the pellicle film is adhered to the pellicle frame through an adhesive layer comprising a fluorine-containing polymer and a substance resulting from curing of an ultraviolet-curing fluorine-containing monomer, wherein the ultraviolet-curing fluorine-containing monomer comprises at least one kind of monomer selected from the group consisting of general formulas (2) and (3):

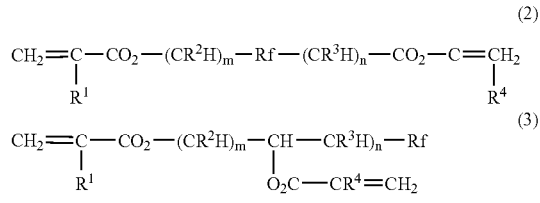

wherein $R^1$ and $R^4$ each independently represent hydrogen of a methyl group, $R^2$ and $R^3$ each independently represent hydrogen or a hydroxyl group, Rf is a fluorine-containing group, and m and n each are an integer of 1 to 8, and the fluorine-containing polymer of said adhesive is a copolymer comprising structural units represented by the following formulas (4), (5), and (6):

12. A method for producing a pellicle including a pellicle film made of fluorine-containing polymer and a pellicle frame for supporting the pellicle film, comprising
adhering the pellicle film to the pellicle frame through an adhesive comprising a fluorine-containing polymer and an ultraviolet-curing fluorine-containing monomer, wherein the ultraviolet-curing fluorine-containing monomer comprises at least one kind of monomer selected from the group consisting of general formulas (2) and (3):

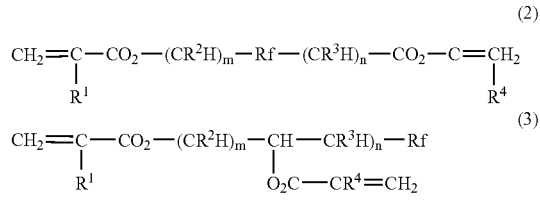

wherein $R^1$ and $R^4$ each independently represent hydrogen or a methyl group, $R^2$ and $R^3$ each independently represent hydrogen or a hydroxyl group, Rf is a fluorine-containing group, and m and n each are an integer of 1 to 8, and the fluorine-containing polymer of said adhesive is a copolymer comprising structural units represented by the following formulas (4), (5), and (6);

13. The pellicle as recited in claim 11, wherein the ratio between the fluorine-containing polymer of said adhesive and the ultraviolet-curing flourine-containing monomer contained in the adhesive layer is fluorine-containing polymer:ultraviolet-curing fluorine-containing monomer =17.0:4.3 to 12.0:36.0 weight ratio) in the case of fluorine-containing monomer represented by general formula (2); and fluorine-containing polymer:ultraviolet-curing fluorine-containing monomer =1:0.25 to 3 (weight ratio) in the case of diacrylate fluorine-containing monomer represented by general formula (3).

14. The method as recited in claim 12, wherein the ratio between the fluorine-containing polymer of said adhesive and the ultraviolet-curing fluorine-containing monomer contained in the adhesive layer is fluorine-containing polymer::ultraviolet curing fluorine-containing monomer =17.0:4.3 to 12.0:36.0 (weight ratio) in the case of flourine-containing monomer represented by general formula (2); and flourine-containing polymer:ultraviolet-curing fluorine-containing monomer =1:0.25 to 3 weight ratio) in the case of diacrylate fluorine-containing monomer represented by general formula (3).

15. The pellicle as recited in claim 11, wherein in the ultraviolet-curing fluorine-containing monomer according to general formulas (2) and (3), $R^1$ and $R^4$ each represent a methyl group.

16. The pellicle as recited in claim 12, wherein in the ultraviolet-curing fluorine-containing monomer according to general formulas (2) and (3), $R^1$ and $R^4$ each represent a methyl group.

17. The pellicle as recited in claim 11, wherein the ultraviolet-curing fluorine-containing monomer represented by general formula (2) is at least one selected from the group consisting of:

$CH_2=CH\text{-}CO_2—CH_2—(CF_2)_2—CH_2—CO_2—CH=CH_2$
$CH_2=CH\text{-}CO_2—CH_2—(CF_2)_4—CH_2—CO_2—CH=CH_2$
$CH_2=CH\text{-}CO_2—CH_2—(CF_2)_6—CH_2—CO_2—CH=CH_2$
$CH_2=CH\text{-}CO_2—CH_2—(CF_2)_8—CH_2—CO_2—CH=CH_2$
$CH_2=CH\text{-}CO_2—(CH_2)_n—(CF_2)_4—(CH_2)_m—CO_2—CH=CH_2$ (n and m are respectively 1 to 3)
$CH_2=C(CH_3)—CO_2—(CH_2)_n—(CF_2)_4—(CH_2)_m—CO_2—CH=CH_2$ (n and m are respectively 1 to 3) and
$CH_2=CH\text{-}CO_2—CH(OH)—(CF_2)_4—(CH)_n—CO_2—CH=CH_2$ (n is 1 to 3).

18. The method as recited in claim 12, wherein the ultraviolet-curing fluorine-containing monomer represented by general formula (2) is at least one selected from the group consisting of:

$CH_2=CH\text{-}CO_2—CH_2—(CF_2)_2—CH_2—CO_2—CH=CH_2$
$CH_2=CH\text{-}CO_2—CH_2—(CF_2O_4—CH_2—CO_2—CH=CH_2$
$CH_2=CH\text{-}CO_2—(CF_2)_6—CH_2—CO_2—CH=CH_2$
$CH_2=CH\text{-}CO_2—(CF_2)_8—CH_2—CO_2—CH=CH_2$
$CH_2=CH\text{-}CO_2—(CF_2)_n—(CF_2)_4—(CH_2)_m—CO_2—CH=CH_2$ (n and m are respectively 1 to 3)
$CH=C(CH_3)—CO_2—CH=CH_2$ (n and m are respectively 1 to 3)
$CH_2=C(CH_3)—CO_2—(CH_2)_n—(CF_{24}—(CH_{2m}—CO_2—C(CH_3)=CH_2$ (n and m are respectively 1 to 3) and $CH_2=CH\text{-}CO_2—CH(OH)—(CF_2)4—(CH)_n—CO_2—CH=CH_2$ (n is 1 to 3).

19. The pellicle as recited in claim 11, wherein the ultraviolet-curing fluorine-containing monomer represented by general formula (3) is at least one selected from the group consisting of:

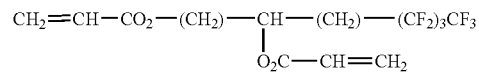

-continued
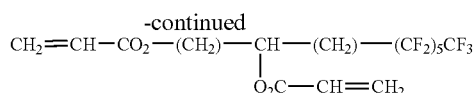
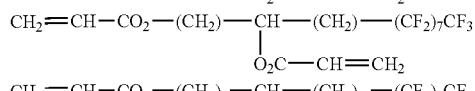
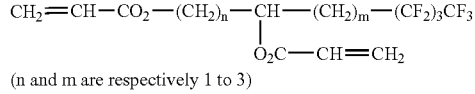
(n and m are respectively 1 to 3)
and
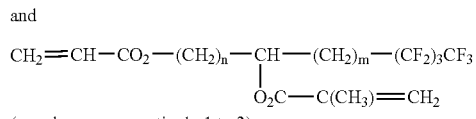
(n and m are respectively 1 to 3).
20. The method as recited in claim 12, wherein the ultraviolet-curing fluorine-containing monomer represented by general formula (3) is at least one selected from the group consisting of:
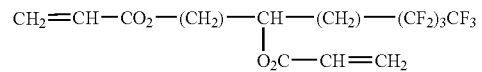
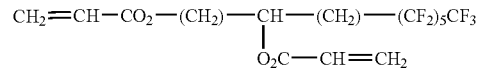
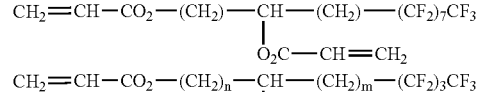
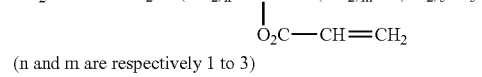
(n and m are respectively 1 to 3)
and
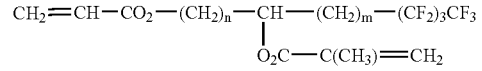
(n and m are respectively 1 to 3).
* * * * *